United States Patent
Chen et al.

(10) Patent No.: US 10,398,046 B2
(45) Date of Patent: Aug. 27, 2019

(54) SERVER RACK WITH DAMPING POST

(71) Applicant: QUANTA COMPUTER INC., Taoyuan (TW)

(72) Inventors: Chao-Jung Chen, Taoyuan (TW); Chih-Ming Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/989,406

(22) Filed: May 25, 2018

(65) Prior Publication Data

US 2019/0239370 A1    Aug. 1, 2019

Related U.S. Application Data

(60) Provisional application No. 62/623,723, filed on Jan. 30, 2018.

(51) Int. Cl.
*H05K 5/02* (2006.01)
*H05K 7/14* (2006.01)

(52) U.S. Cl.
CPC ......... *H05K 5/0234* (2013.01); *H05K 7/1488* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,877,938 | A * | 3/1999 | Hobbs | G06F 1/183 312/223.2 |
| 6,252,768 | B1 * | 6/2001 | Lin | G06F 1/1616 248/624 |
| 7,120,013 | B1 * | 10/2006 | Hutchings, IV | G11B 33/125 361/679.34 |
| 7,461,849 | B2 | 12/2008 | Robbins et al. | |
| 7,540,509 | B1 * | 6/2009 | Boraas | B60B 33/0002 16/30 |
| 8,817,464 | B2 * | 8/2014 | Jau | H05K 7/1492 361/679.48 |
| 9,291,234 | B1 * | 3/2016 | Green | B65D 19/40 |
| 9,423,001 | B2 * | 8/2016 | Green | B65D 19/40 |
| 9,832,912 | B2 * | 11/2017 | Klein | H05K 7/20745 |

(Continued)

FOREIGN PATENT DOCUMENTS

| | | |
|---|---|---|
| CN | 203722947 U | 7/2014 |
| TW | 200823144 A | 6/2008 |

(Continued)

OTHER PUBLICATIONS

TW Office Action for Application No. 107127681, dated Mar. 4, 2019, w/ First Office Action Summary.

(Continued)

*Primary Examiner* — Lisa Lea-Edmonds
(74) *Attorney, Agent, or Firm* — Nixon Peabody LLP; Zhou Lu

(57) ABSTRACT

A server rack is pre-loaded with servers, prior to the server rack being transported to a data center. In order to facilitate movement of the pre-loaded servers and server rack into the data center, dampers are provided on the underside of the server rack. The dampers absorb vibration as the server rack and servers are moved to, or within, the data center on transporting pallets.

16 Claims, 3 Drawing Sheets

(56) References Cited

U.S. PATENT DOCUMENTS

| | | | |
|---|---|---|---|
| 9,955,608 B2* | 4/2018 | Davis | H05K 7/1488 |
| 10,069,625 B2* | 9/2018 | Chen | H04L 9/0827 |
| 2008/0285225 A1* | 11/2008 | DeMoss | G06F 1/187 |
| | | | 361/679.34 |
| 2009/0120887 A1* | 5/2009 | Meehan | B65D 19/385 |
| | | | 211/85.8 |
| 2012/0113570 A1 | 5/2012 | Yang et al. | |
| 2012/0327591 A1* | 12/2012 | Jau | H05K 7/1492 |
| | | | 361/679.48 |
| 2015/0237760 A1* | 8/2015 | Jau | H05K 7/1491 |
| | | | 361/679.02 |
| 2015/0351535 A9 | 12/2015 | Bernet et al. | |
| 2016/0107793 A1 | 4/2016 | Jiang et al. | |

FOREIGN PATENT DOCUMENTS

| | | |
|---|---|---|
| TW | 201143583 A | 12/2011 |
| TW | M479492 U | 6/2014 |

OTHER PUBLICATIONS

TW Search Report for Application No. 107127681 dated Mar. 4, 2019, w/ First Office Action.
Extended European Search Report for EP Application No. 18198231.5 dated May 3, 2019.

* cited by examiner

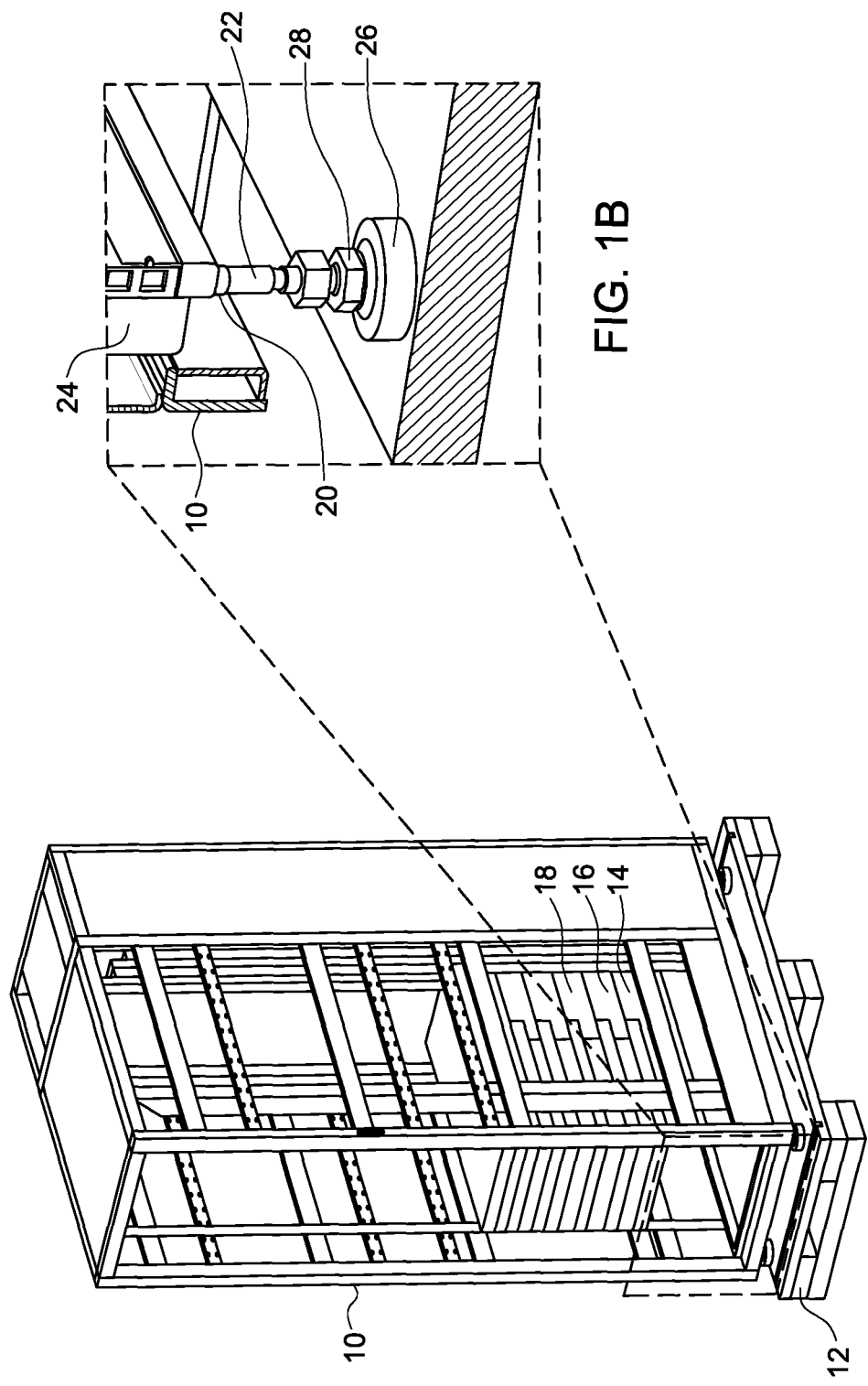

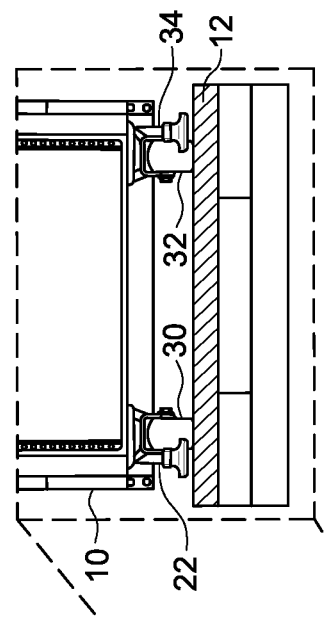
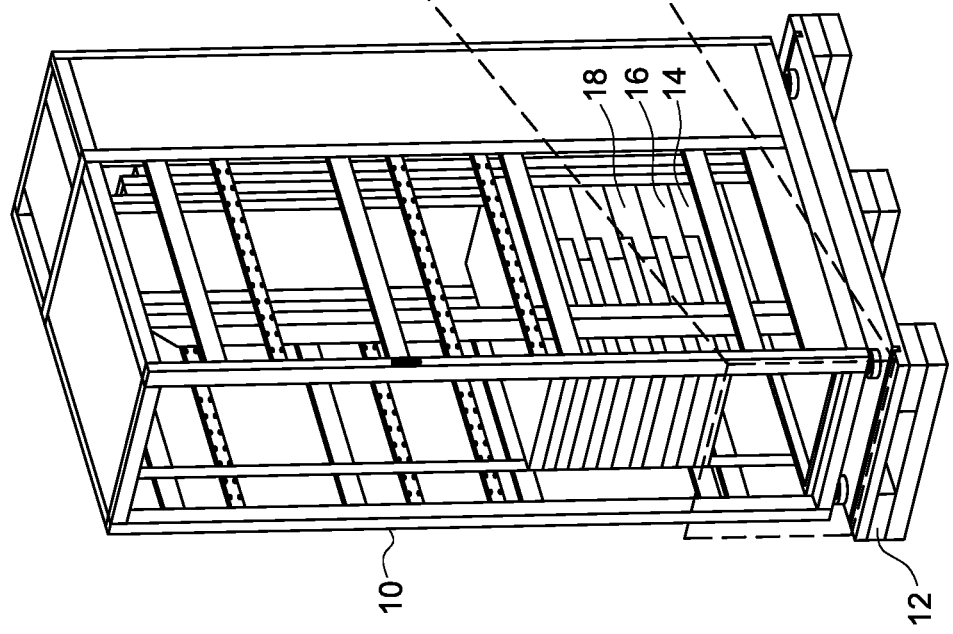
FIG. 2B
FIG. 2A

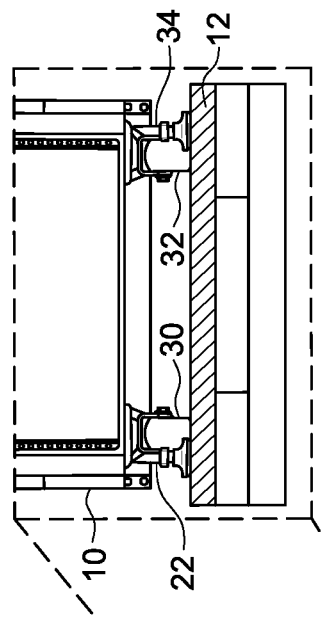
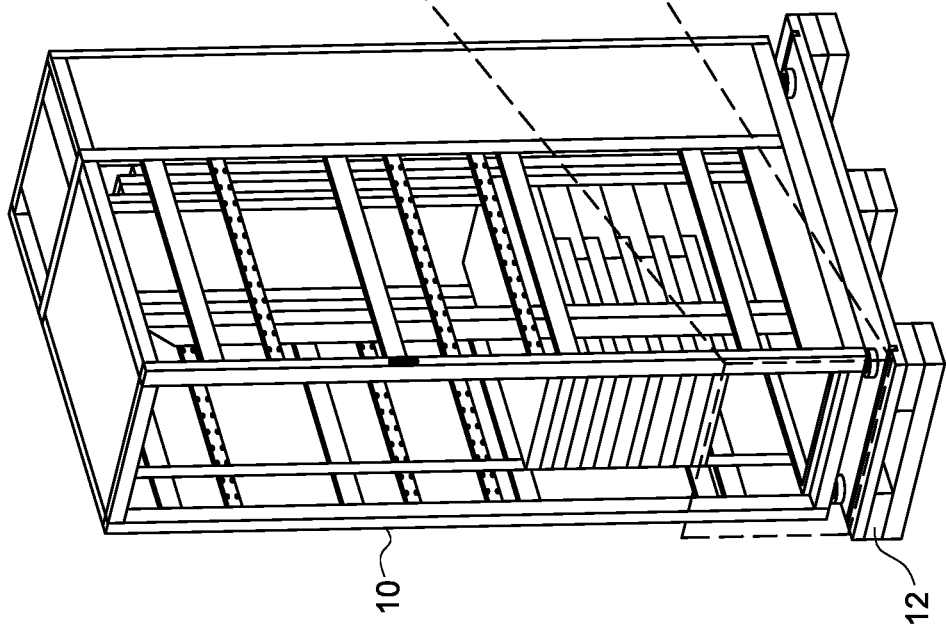
FIG. 3B
FIG. 3A

SERVER RACK WITH DAMPING POST

CROSS REFERENCE TO RELATED APPLICATIONS

This application claims priority to and the benefit of U.S. Provisional Patent Application No. 62/623,723, entitled "RACK WITH DAMPING POST" and filed Jan. 30, 2018, the contents of which are herein incorporated by reference in their entirety as if fully set forth herein.

FIELD

In order to reduce some of the stress placed upon servers pre-loaded into server racks, an adjustable leveling foot with a damping function is provided under the posts of a server rack to directly absorb vibration when the server rack is transported as a unit. A transporting system and method of transporting pre-loaded servers are also disclosed.

BACKGROUND

With data center construction time requirements growing shorter and shorter, a server that is pre-installed in a server rack for transport to the data center, thereby shortening the data center construction lead time, has become a new trend. However, transporting pre-installed servers presents new challenges, such as providing anti-vibration protection to the servers while ensuring adequate strength in the server rack.

SUMMARY

In one embodiment according to this disclosure, an adjustable leveling foot with a damping function is provided under the posts of a server rack upon which servers have been installed.

In another embodiment of this disclosure, a direct support of the server rack on a transport pallet directly absorbs vibration when the server rack is transported, thereby protecting both the servers and the server rack.

In a still further embodiment according to this disclosure, an adjustable foot with a damper function is provided under the rack posts, with the adjustable foot being raised to an upper, normal operating position when the server rack is installed. At the same time, the adjustable foot is capable of being moved to a lower transporting position, such that it directly contacts a transporting pallet, thereby protecting both the server and server rack from vibration during transport.

These and other objects and embodiments of the structure and function of the leveling foot will be understood with reference to the detailed description and the appended drawings.

BRIEF DESCRIPTION OF THE DRAWINGS

FIG. 1A is a schematic illustration of a server rack resting upon a transporting pallet.

FIG. 1B is a magnified view of a portion of FIG. 1A to illustrate details of the adjustable leveling foot with a damping function.

FIG. 2A is a schematic representation of a server rack upon a transporting pallet with the adjustable foot adjusted to its upper, normal position.

FIG. 2B is a magnified view of a portion of FIG. 2A to illustrate details of the adjustable leveling foot with a damping function.

FIG. 3A is a schematic illustration of a server rack resting upon a transporting pallet, with the adjustable leveling foot with a damping function lowered into engagement with the transporting pallet.

FIG. 3B is a magnified view of a portion of FIG. 3A to illustrate details of the adjustable leveling foot with a damping function lowered into contact with the transporting pallet.

DETAILED DESCRIPTION

The present invention is described with reference to the attached figures, wherein like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In order to meet the accelerated construction schedules of data centers, it has been proposed that servers be installed into the server racks before transporting the server racks to the data center. While this procedure is becoming a new trend to hasten the construction of data centers, the transportation of both the servers installed in the server rack, and the server rack itself, exposes both to vibration.

FIG. 1A schematically illustrates a server rack 10 on a transporting pallet 12. Transporting pallet 12 is usually made exclusively of wood, although plastics and wood-based products, such as pressboard, fiberboard, laminated veneer lumber and other wood substitutes, can be employed as the transporting pallet 12. Servers 14, 16, 18, etc. are pre-loaded onto the server rack 10 before transportation of the server rack 10 to the data center. FIG. 1B illustrates details of the server rack 10 and its rack post 24, beneath which is placed damper 20 and adjustable leveling foot 22. In FIG. 1A, the lower extremity 26 of leveling foot 22 is in engagement with the transporting pallet 12. An adjustment device, such as leveling foot 28, which can be threadedly rotated to adjust the position of lower extremity 26, can move the lower extremity 26 into, or out of contact with transporting pallet 12. In addition to the rotation of the threads to adjust the leveling foot 22, other mechanisms, such as a lever, can be employed to adjust the leveling foot 22. The damper 20 can be of varied construction. For example, damper 20 can be formed of an elastomeric rubber or rubbery polymer to absorb the vibration imparted to the server rack 10 and servers 14, 16, 18, etc., positioned within the server rack 10, during movement of the server rack 10 and the transporting pallet 12. Alternatively, damper 20 can comprise a hydraulic, incompressible fluid that moves between chambers in the manner of a shock absorber. Still further, damper 20 can take the form of mechanical springs to absorb the vibration energy imparted to the server rack 10 and servers 14, 16, 18, etc., upon transportation to a data center. In addition to the mechanical springs and hydraulic fluid previously discussed, pneumatic fluid can be employed in a shock absorber. Air is the most readily and inexpensive gas to use in a pneumatic shock absorber, but other gasses can be employed in lieu of air, such as nitrogen gas.

FIG. 2A is another embodiment according to this invention, which as can be seen in the magnified view of FIG. 2B, additionally provides wheels in the form of casters 30, 32. These support the weight of the server rack 10 and servers 14, 16, 18, etc., when the adjustable leveling feet 22, 34 are positioned in their normal, upward position so as to allow the weight of the server rack 10 and servers contained therein, to be carried by the casters 30, 32. It is to be understood that additional wheels and/or casters (not shown) may also be provided to carry the weight of the server rack 10, and servers contained therein, after the servers are moved to or within a data center. FIG. 2b illustrates the movement of the damping, leveling feet 22, 34, to an upper position, such that all the weight of the server rack 10, and pre-loaded servers 14, 16, 18, are borne by the casters 30, 32, and not borne by the leveling feet 22, 34.

FIG. 3A is yet another embodiment according to the disclosure where, as can be seen in the magnified view of FIG. 3B, the adjustable leveling feet 22, 34, are lowered into contact with the transporting pallet 12. In this position, the weight of the server rack 10 and the servers 14, 16, 18, etc., contained within the server rack 10, are transferred from casters 30, 32, to the damper 20 of each of the adjustable leveling feet 22, 34, to absorb the vibration when the transporting pallet 12 to, or within, a data center.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

We claim:

1. A server rack in a datacenter, comprising:
a server rack into installed with one or more servers, the server rack comprising a post at a lower end of the server rack;
a damper mounted on the post; and
a transporting pallet to transport the server rack and the one or more servers installed to the datacenter.

2. The server rack of claim 1, herein the damper is constructed of a material that will absorb vibration energy during movement of the rack.

3. The server rack of claim 1, further comprising at least one foot, wherein the damper is positioned between the post and foot.

4. The server rack of claim 3, further comprising at least one wheel mounted on said rack.

5. The server rack of claim 3, further comprising at least one caster mounted on said rack.

6. The server rack of claim 1, further comprising at least one wheel mounted on the server rack.

7. A method of pre-installing servers into a server rack prior to moving the server rack into a data center, the method comprising:
providing a server rack with servers pre-installed in the rack;
combining the server rack with a transporting pallet to transport the server rack and servers installed to, a data center; and
providing a damper between the server rack and the transporting pallet.

8. The method of claim 7, further comprising posts extending from a lowermost portion of the server rack, and positioning the damper on the posts.

9. The method of claim 8, further comprising providing adjustable feet between the damper and the transporting pallet.

10. The method of claim 9, further comprising providing a plurality of wheels on a lowermost portion of the server rack.

11. The method of claim 10, further comprising adjusting the adjustable feet such that all of the weight of the servers and the server rack are borne by the dampers, and not borne by the wheels.

12. The method according to claim 11, further comprising adjusting the adjustable feet such that all the weight of the servers and server rack are borne by the wheels, and not borne by the feet.

13. The method according to claim 12, wherein the adjusting step in which the weight of the servers and server rack are borne by the wheels, and not borne by the feet, is performed after moving the server rack into a data center.

14. A server rack in a datacenter, comprising:
a lowermost portion, the lowermost portion of the server rack being provided with adjustable feet and a plurality of wheels, wherein each of the adjustable feet is provided with a damper to absorb vibration energy, the damper being positioned between the server rack and each of the feet; and
a transporting pallet to transport the server rack and one or more servers installed to the datacenter.

15. The server rack according to claim 14, wherein the lowermost portion of the server rack is provided with a plurality of posts, and the damper is positioned on each post.

16. The server rack of claim 15, wherein the adjustable feet, and not the wheels, are in contact with the transporting pallet.

* * * * *